(12) United States Patent
Shi et al.

(10) Patent No.: US 7,838,345 B2
(45) Date of Patent: Nov. 23, 2010

(54) ELECTRONIC DEVICE INCLUDING SEMICONDUCTOR FINS AND A PROCESS FOR FORMING THE ELECTRONIC DEVICE

(75) Inventors: Zhonghai Shi, Austin, TX (US); Bich-Yen Nguyen, Austin, TX (US); Héctor Sánchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1172 days.

(21) Appl. No.: 11/416,436

(22) Filed: May 2, 2006

(65) Prior Publication Data

US 2007/0259485 A1 Nov. 8, 2007

(51) Int. Cl.
*H01L 21/00* (2006.01)
(52) U.S. Cl. ............. 438/149; 257/308; 257/722; 257/E21.014; 257/E21.637; 257/E21.623
(58) Field of Classification Search ........... 257/300, 257/722, 308, 702, E21.014, E21.263, E21.637, 257/E21.623; 438/253, 157, 176, 238, 149, 438/151, 283
See application file for complete search history.

(56) References Cited

U.S. PATENT DOCUMENTS 6,858,478 B2 * 2/2005 Chau et al. ............... 438/149
7,423,321 B2 * 9/2008 Liao et al. ............... 257/347
7,453,124 B2 * 11/2008 Adan ....................... 257/365
7,728,360 B2 * 6/2010 Chen et al. ............... 257/202

OTHER PUBLICATIONS

U.S. Appl. No. 11/339,101, filed Jan. 25, 2006; first-named inventor Sinan Goktepeli; entitled Method for Producing Two Gates Controlling the Same Channel.

* cited by examiner

*Primary Examiner*—Davienne Monbleau
*Assistant Examiner*—Monica D Harrison

(57) ABSTRACT

An electronic device can include a first semiconductor fin and a second semiconductor fin, each spaced-apart from the other. The electronic device can also include a bridge lying between and contacting each of the first semiconductor fin and the second semiconductor fin along only a portion of length of each of the first semiconductor fin and the second semiconductor fin, respectively. In another aspect, a process for forming an electronic device can include forming a first semiconductor fin and a second semiconductor fin from a semiconductor layer, each of the first semiconductor fin and the second semiconductor fin spaced-apart from the other. The process can also include forming a bridge that contacts the first semiconductor fin and second semiconductor fin. The process can further include forming a conductive member, including a gate electrode, lying between the first semiconductor fin and second semiconductor fin.

14 Claims, 3 Drawing Sheets

ELECTRONIC DEVICE INCLUDING SEMICONDUCTOR FINS AND A PROCESS FOR FORMING THE ELECTRONIC DEVICE

BACKGROUND

1. Field of the Disclosure

The present disclosure relates to electronic devices, more particularly, to electronic devices including semiconductor fins overlying an insulating layer.

2. Description of the Related Art

A dual gate oxide ("DGO") transistor can have a relatively longer channel length than another device designed to operate a lower voltage. A planar DGO transistor is conventional, but can cover a larger area from a top view and have relatively lower performance than a corresponding device including one or more fin structures. However, fin structures can be fragile, and therefore, are more difficult to manufacture than the corresponding planar device. One approach can be to make individual fin structures wider and correspondingly more physically robust. This approach can reduce the area and performance advantages of using a transistor including one or more fin structures.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
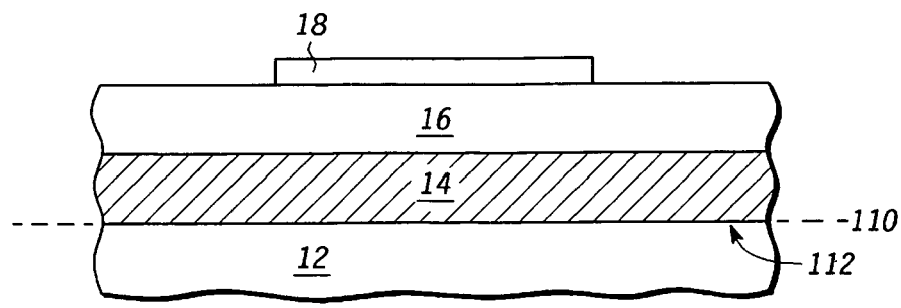
FIG. 1 includes an illustration of a cross-sectional view of a portion of a workpiece where an electronic component can subsequently be formed.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a first semiconductor fin having a first length. The electronic device can also include a second semiconductor fin, spaced-apart from the first semiconductor fin and having a second length. The electronic device can further include a first bridge lying between the first semiconductor fin and the second semiconductor fin. The first bridge can contact the first semiconductor fin along only a portion of the first length, and the second semiconductor fin along only a portion of the second length.

In another aspect, an electronic device can include a transistor structure. The transistor structure can include a first semiconductor fin including a first channel region, and a second semiconductor fin spaced-apart from the first semiconductor fin and including a second channel region. The electronic device can also include a bridge lying between the first semiconductor fin and the second semiconductor fin and contacting the first semiconductor fin and the second semiconductor fin. The electronic device can further include a conductive member, overlying the first semiconductor fin, the second semiconductor fin, and the bridge. A portion of the conductive member can lie adjacent to both sides of the first semiconductor fin and can lie adjacent to both sides of the second semiconductor fin. The first channel region of the first semiconductor fin and the second channel region of the second semiconductor fin can each be configured such that when the transistor would be on, charge carriers would flow through first channel region, the second channel region, or any combination thereof in a direction substantially parallel to a primary surface of the electronic device.

A process of forming an electronic device can include providing a substrate including a base layer, an insulating layer, and a semiconductor layer. The insulating layer can lie between the base layer and the semiconductor layer. The process can also include forming a first semiconductor fin from the semiconductor layer. The process can further include forming a second semiconductor fin from the semiconductor layer, wherein the second semiconductor fin is spaced-apart from the first semiconductor fin. The process can still further include forming a bridge over the insulating layer, wherein the bridge contacts the first semiconductor fin and the second semiconductor fin. The process can yet further include forming a conductive member, including a gate electrode, over the first semiconductor fin, the second semiconductor fin, and the bridge. The conductive member can lie between the first semiconductor fin and the second semiconductor fin. Specific embodiments of the present disclosure will be better understood with reference to the description below and the accompanying figures.

Some terms are defined or clarified as to their intended meaning as they are used within this specification. The term "averaged," when referring to a value, is intended to mean an intermediate value between a high value and a low value. For example, an averaged value can be an average, a geometric mean, or a median.

The term "composition" is intended to indicate a group of elements in a specific ratio of materials. For example a semiconductor composition can be $Si_xGe_y$. $Si_{(x-a)}Ge_{(y+a)}$, where "a" is a value between approximately 0 and approximately "x", would be considered a different semiconductor composition from $Si_xGe_y$. As used herein, subscripts on compound materials specified with alphabetic subscripts are intended to represent the non-zero fraction of the atomic species present in that compound, and therefore, the alphabetic subscripts within a compound sum to 1. For example, in the case of $Si_aGe_bC_c$, the sum of "a," "b," and "c" is 1.

As used herein a "compound semiconductor" is a semiconductor material including two or more different semiconductor elements. $Si_xGe_y$ is can example of a compound semiconductor.

As used herein, the dimensional terms "length" and "width" will be used with respect to dimensions from a top view. The width is intended to mean the shortest dimension from the top view and the length is the dimension perpendicular to the shortest dimension. The dimensional term "thickness" will be used with respect to the dimension perpendicular to the length and the width.

The term "material" is intended to indicate an element or elements within a layer or feature. For example a semiconductor material can be $Si_xGe_y$. $Si_xGe_y$ and $Si_aGe_bC_c$ would be considered different semiconductor materials.

The term "semiconductor material" is intended to indicate a semiconductor element within a layer or feature. For example, a boron doped $Si_xGe_y$ layer with a concentration of 1E21 atoms per cubic centimeter is considered the same semiconductor material as an undoped $Si_xGe_y$ layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a cross-sectional view of a portion of a workpiece 10 where an electronic component of an electronic device can subsequently be formed. The workpiece 10 can include a base layer 12, an insulating layer 14, a semiconductor layer 16, and a protective layer 18. In the illustrated embodiment, the base layer 12 can be a support layer and provide mechanical support for the other layers of the workpiece 10. For example, the base layer 12 can include an insulating material typically used in manufacturing semiconductor devices such as quartz, glass, plastic, or any combination thereof. In another embodiment, the base layer 12 can include a semiconductor material including a semiconductor element, such as silicon, germanium, carbon, or any combination thereof. A surface of the base layer 12 can lie along a plane 110 and serve as a primary surface 112 of the workpiece 10 or a subsequently formed electronic device.

The insulating layer 14 can have a thickness in a range of approximately 5 to approximately 1000 nm. The insulating layer 14 can include an oxide, a nitride, an oxynitride, or any combination thereof. The semiconductor layer 16 can include a semiconductor material such as silicon, germanium, carbon, a compound semiconductor material or any combination thereof and have a substantially uniform thickness in a range of approximately 20 to approximately 150 nm. The semiconductor layer 16 can include a p-type dopant, such as boron, an n-type dopant, such as arsenic or phosphorus, or any combination thereof. The protective layer 18 can be formed over the semiconductor layer 16 by a conventional or proprietary process and serve to protect portions of the semiconductor layer 16 during subsequent processing. The protective layer 18 can include a material as previously described for the insulating layer 14. The material of the protective layer 18 can include substantially a same as or different material compared to the insulating layer 14. The protective layer 18 can have a thickness in a range of approximately 10 to approximately 100 nm.

Figure 2:
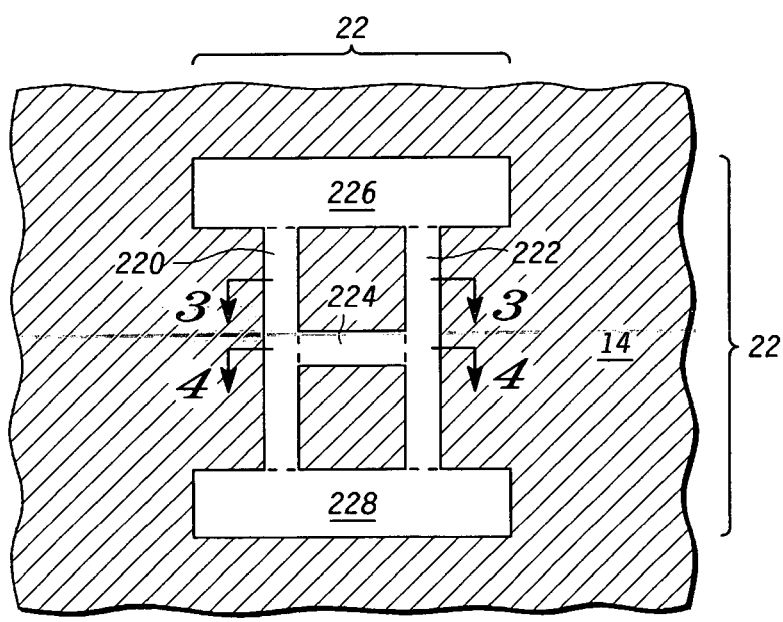
FIG. 2 includes an illustration of a top view of a portion of the workpiece of FIG. 1 after forming a structure.
Figure 3:
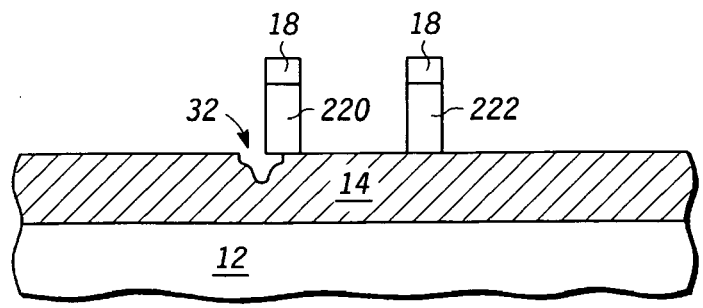
FIG. 3 includes an illustration of a cross-sectional view of a portion of the workpiece of FIG. 2 along section line 3-3 and through a defect.
Figure 4:
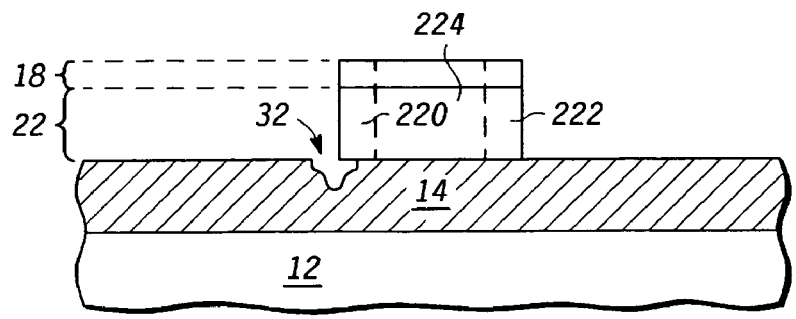
FIG. 4 includes an illustration of a cross-sectional view of a portion of the workpiece of FIG. 2 along section line 4-4 and through the defect.

FIGS. 2, 3, and 4 includes illustrations of a portion of the workpiece 10 after removing a portion of the semiconductor layer 16 to form a structure 22. Throughout this specification, some layers are not illustrated in top view to better illustrate the relative positions of other features of the electronic device. For example, in a top view illustration in FIG. 2, the protective layer 18 is not illustrated to more clearly indicate the relative positions of portions of the structure 22. The structure 22 can include a semiconductor fin 220, a semiconductor fin 222, a bridge 224, a portion 226 and a portion 228. Each of the portions of the structure 22 can include a portion of the semiconductor layer 16. Each of the semiconductor fin 220 and the semiconductor fin 222 can contact the portion 226 and the portion 228. The bridge 224 can be spaced-apart from the portion 226 and the portion 228.

The semiconductor fin 220 and the semiconductor fin 222 can overlie the insulating layer 14 and be spaced-apart from each other, as illustrated in a cross-sectional view in FIG. 3. The bridge 224 can lie between the semiconductor fin 220 and the semiconductor fin 222, and contact each of the semiconductor fin 220 and the semiconductor fin 222 along only a portion of their respective lengths, as illustrated in the top view in FIG. 2. In one embodiment, the bridge 224 can have a same or different thickness with respect to the semiconductor fin 220 or the semiconductor fin 222. In another embodiment, the protective layer 18 may or may not overlie the bridge. As illustrated in FIG. 4, contact between the bridge 224 and the semiconductor fin 220 can provide additional support for the semiconductor fin 220 such that the semiconductor fin 220 can be less likely to fail in the presence of a defect 32 than if the bridge were not present.

In a particular embodiment, the bridge 224 can include an insulating material, as previously described for the insulating layer 14, or a different semiconductor material than the semiconductor layer 16. In another particular embodiment, the bridge 224 can be formed from the semiconductor layer 16 with a thickness substantially less than the thickness of the semiconductor fin 220 and the semiconductor fin 222. In a more particular embodiment, the semiconductor fin 220 and the semiconductor fin 222 can be formed with a width substantially at least at approximately a resolution limit for a patterning process. The semiconductor fin 222 can be formed with a width smaller than the resolution limit. For example, if the resolution limit is 65 nm, the semiconductor fin 220 and the semiconductor fin 222 can have a width of at least approximately 65 nm, and the bridge can have a width less than 65 nm. A different lithographic process can have a resolution greater than or less than 65 nm.

The bridge 224 can be formed at the same or a different time by the same or a different conventional or proprietary process as the semiconductor fin 220, the semiconductor fin 222, the portion 226, or the portion 228. In one embodiment, the bridge 224 can be patterned and formed simultaneously at a substantially same point in time as the semiconductor fin 220. In another embodiment, each of the portion 226 or the portion 228 can be formed at the same or a different time by the same or a different conventional or proprietary process as the semiconductor fin 220, the semiconductor fin 222, the bridge 224, or the other portion.

In a particular embodiment, the defect 32 can compromise the support for the semiconductor fin 220. As illustrated in the FIGS. 3 and 4, a portion of the insulating layer 14 along the base of and adjacent to the semiconductor fin 220 can be removed during processing to form the defect 32. For example, the defect 32 can be formed when removing a portion of the semiconductor layer 16 to form the semiconductor fin 220. The defect 32 could also be formed at another time or during a different processing operation. In one embodiment, the defect 32 can undercut the semiconductor fin 220. The defect 32 can increase the likelihood of a failure such as the semiconductor fin 220 collapsing, breaking, falling over, or any combination thereof. The bridge 224 can help to provide additional mechanical support to significantly reduce the likelihood of such a failure.

Figure 5:
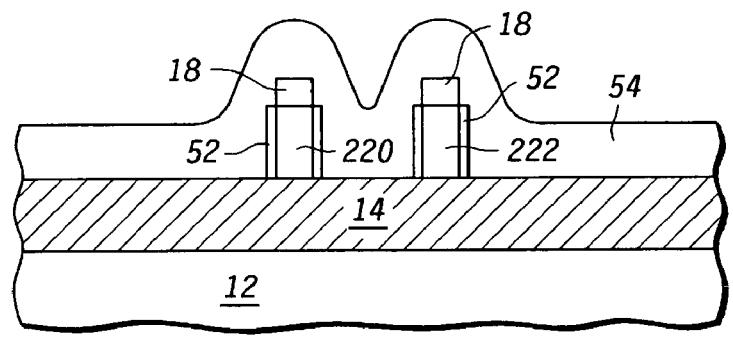
FIG. 5 includes an illustration of a cross-sectional view of a portion of a workpiece similar to the workpiece illustrated in FIG. 3 after forming a conductive layer.

FIG. 5 includes a cross-sectional illustration of a portion of a workpiece 50, at a location similar to that illustrated in FIG. 3 within the workpiece 10 after forming a dielectric layer 52 and a conductive layer 54. The workpiece 50 is similar to the workpiece 10 except that the defect 32 is not present within the workpiece 50. The dielectric layer 52 can serve as a gate dielectric layer. The dielectric layer 52 can include a film of silicon dioxide, silicon nitride, silicon oxynitride, a high dielectric constant ("high-k") material (e.g., dielectric constant greater than 8), or any combination thereof. The high-k material can include a metal oxide, a metal nitride, a metal oxynitride, a metal semiconductor oxide, a metal semiconductor nitride, a metal semiconductor oxynitride, or any combination thereof. Examples of high-k materials can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. The dielectric layer 52 can have a thickness in a range of approximately 1 to approximately 25 nm. The dielectric layer 52 may be thermally grown using an oxidizing or nitridizing ambient, or deposited using a conventional or proprietary chemical vapor deposition ("CVD") technique, physical vapor deposition ("PVD") technique, or any combination thereof.

The conductive layer 54 can be formed overlying and spaced-apart from the semiconductor fin 220 and the semiconductor fin 222. The conductive layer 54 can include semiconductor material suitable for forming a gate electrode of the electronic component. The conductive layer 54 can include a conductive material that includes silicon, germanium, carbon, a conductive metal-oxide, a conductive metal-nitride, a metal-semiconductor material, another suitable gate electrode material, or any combination thereof. In one embodiment, the material of the conductive layer 54 can include platinum, ytterbium, palladium, iridium, osmium, ruthenium, rhenium, indium-tin, indium-zinc, aluminum-tin, or any combination thereof. The conductive layer 54 can have a thickness of between approximately 30 and approximately 200 nm and can be grown or deposited using a conventional or proprietary technique, such as a CVD technique, PVD technique, or any combination thereof. In one embodiment, the conductive layer 54 can include an n-type dopant. In another embodiment, the conductive layer 54 can include a p-type dopant.

Figure 6:
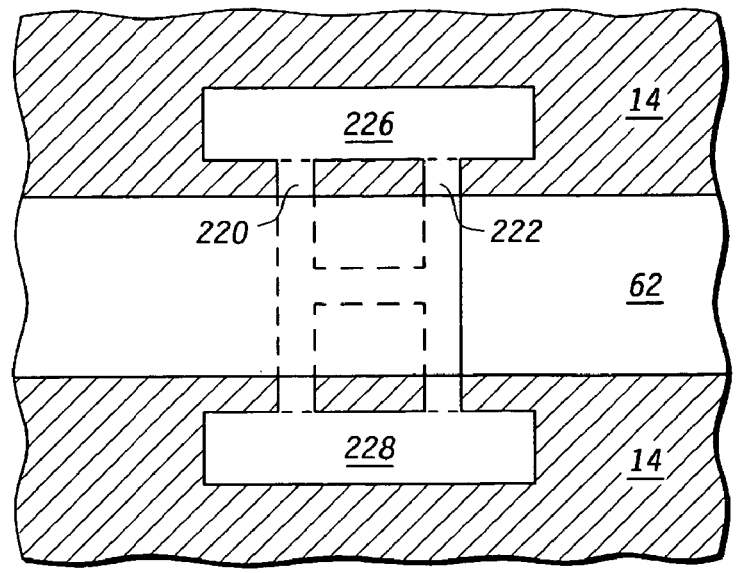
FIG. 6 includes an illustration of a top view of a portion of the workpiece of FIG. 5 after forming a conductive member.

FIG. 6 includes an illustration of a top view of a portion of the workpiece 50 after forming a conductive member 62 from the conductive layer 54. A conventional or proprietary lithographic process is used to form a masking layer (not illustrated) overlying the conductive layer 54. Exposed portions of the conductive layer 54 can then be removed by a conventional or a proprietary etch process. In one embodiment, the etch process can remove the material of the conductive layer 54 to expose portions of the protective layer 18 and the insulating layer 14. The masking layer can be removed from the workpiece 50. In one embodiment, the conductive member 62 can overlie and be spaced-apart from the semiconductor fin 220 and the semiconductor fin 222. In particular embodiment, a portion of the conductive member 62 can lie adjacent to both sides of the semiconductor fin 220 and both sides of the semiconductor fin 222. In a more particular embodiment, a portion of the conductive member 62 can lie between the semiconductor fin 220 and the semiconductor fin 222. In another embodiment, the conductive member 62 can overlie the bridge 224.

Exposed portions of the protective layer 18 can be removed. In one embodiment, dopant can be introduced to the portion 226, the portion 228, an exposed portion of the semiconductor fin 220, and an exposed portion of the semiconductor fin 222 and be activated to form a source/drain region using a conventional or proprietary process. In a particular embodiment, the exposed portion of the semiconductor fin 220 can form a first source/drain region and a second source/drain region spaced-apart from the first source/drain region. The first source/drain region and the second source/drain region can be electrically coupled to the semiconductor fin 220. In a more particular embodiment, the first source/drain region and the second source/drain region can be electrically connected to the semiconductor fin 220. In another particular embodiment, the exposed portion of the semiconductor fin 222 can form a third source/drain region and a fourth source/drain region spaced apart from the third source-drain region. The third source/drain region and the fourth source/drain region can be electrically coupled to the semiconductor fin 222. In another more particular embodiment, the third source/drain region and the fourth source/drain region can be electrically connected to the semiconductor fin 222. In a more particular embodiment, the first source/drain region can be electrically coupled to the third source/drain region by the portion 226, and the second source/drain region can be electrically coupled to the fourth source/drain region by the portion 228. In an even more particular embodiment, the first source/drain region can be electrically connected to the third source/drain region by the portion 226, and the second source/drain region can be electrically connected to the fourth source/drain region by the portion 228.

Figure 7:
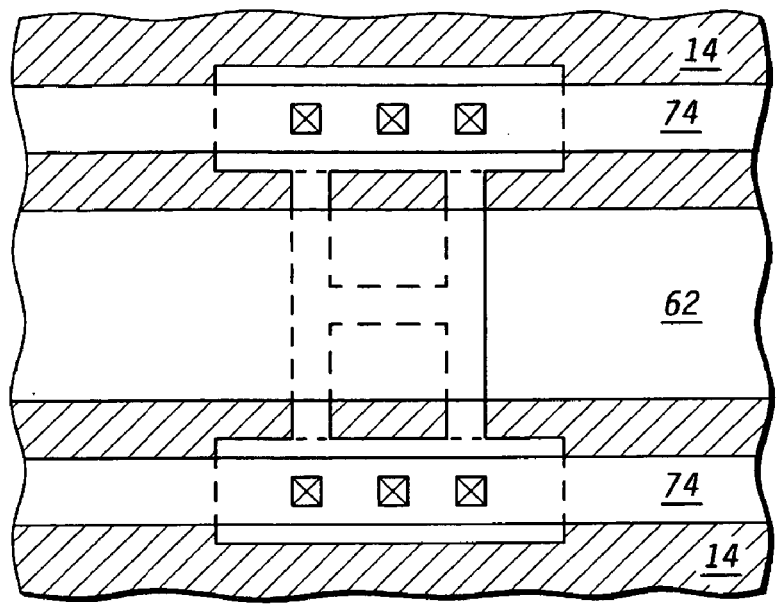
FIG. 7 includes an illustration of a top view of a portion of the workpiece of FIG. 6 after substantial completion of the electronic component of an electronic device.

FIG. 7 includes an illustration of a top view of a substantially complete electronic device. An insulating layer, a conductive layer 74, and an encapsulating layer are formed using one or more conventional or proprietary techniques to form the substantially complete electronic device.

Figure 8:
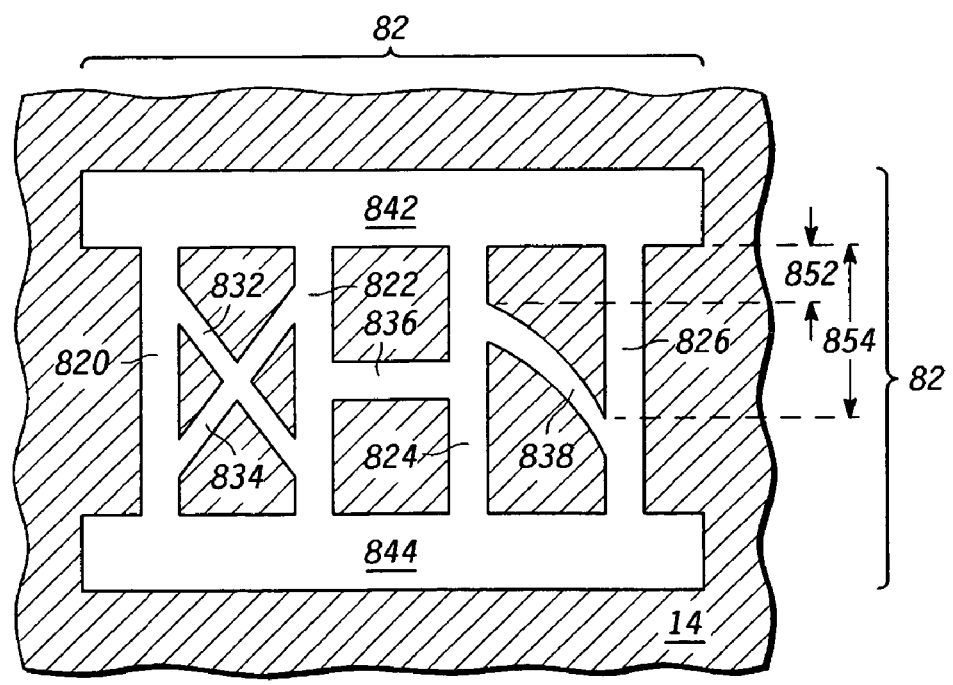
FIG. 8 includes an illustration of a top view of a portion of a workpiece of FIG. 1 after forming a structure according to an alternative embodiment.

In another aspect, a structure can have an additional semiconductor fin, an additional bridge, or any combination thereof. A bridge can have a wide variety of different shapes and can have a wide variety of different contact angles relative to a semiconductor fin. In one embodiment, a structure 82 of a workpiece 80 is illustrated in FIG. 8 at a point in processing similar to the structure 22 of the workpiece 10 of FIG. 2. The structure 82 can include a semiconductor fin 820, a semiconductor fin 822, semiconductor fin 824, and a semiconductor fin 826. The structure 82 can also include a bridge 832, a bridge 834, a bridge 836, and a bridge 838. The structure 82 can further include a portion 842 and a portion 844.

The semiconductor fin 820 can contact the portion 842 and the portion 844. Each of the bridge 832 and the bridge 834 can contact the semiconductor fin 820 and the semiconductor fin 822. In one embodiment (not illustrated), the bridge 832 and the bridge 834 can be spaced-apart from each other and the portion 842 and the portion 844. In another embodiment, each of the bridge 832 and the bridge 834 can contact each of the semiconductor fin 820, the semiconductor fin 822 and the other bridge, along only a portion of each of their respective lengths. In a particular embodiment, the bridge 832 and the bridge 834 can form an "X" shape. Such a structure can be more rigid than a structure where the bridge 832 and the bridge 834 do not contact each other.

The semiconductor fin 826 can contact the portion 842 and the portion 844. The bridge 838 can contact the semiconductor fin 824 and the semiconductor fin 826. In one embodiment, from a top view, the bridge 838 can include a curved, serpentine, or otherwise shaped portion. In another embodiment, the bridge 838 contacts the semiconductor fin 824 a distance 852 from the portion 842 and the semiconductor fin 826 at a distance 854 from the portion 842. The distance 852 can be different from than the distance 854. In a particular embodiment, the distance 852 is shorter then the distance 854. In the illustrated embodiment, the bridge 838 may transfer less stress between the semiconductor fin 824 and than the semiconductor fin 826 transfers between the semiconductor fin 822 and the semiconductor fin 824. After reading this specification, skilled artisans will appreciate that not all shapes in the structure 82 are required and that shapes and contact points for bridges can be selected to meet the needs or desires of an electronic device designer. Processing can proceed as previously described for the FIGS. 5 through 7 to form a substantially complete electronic device.

Embodiments as described herein can provide benefits to electronic devices formed using the processes as described herein. A bridge that contacts the first semiconductor fin along only a portion of the first length, and the second semiconductor fin along only a portion of the second length can improve the physical robustness of an electronic component with more than one semiconductor fin. The number, shape, arrangement or any combination thereof of bridge(s) can differ between semiconductor fins. By including a bridge, it is possible to form an electronic component using relatively longer semiconductor fins without thickening them to improve the strength. In one embodiment, a semiconductor component can be formed including a defect 32 that would had failed had the bridge 224 not been in contact with a semiconductor fin 220.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a first semiconductor fin, wherein the first semiconductor fin has a first length. The electronic device can further include a second semiconductor fin, spaced-apart from the first semiconductor fin, wherein the second semiconductor fin has a second length. The electronic device can still further include a first bridge lying between the first semiconductor fin and the second semiconductor fin. The first bridge can contact the first semiconductor fin along only a portion of the first length, and the second semiconductor fin along only a portion of the second length.

In one embodiment of the first aspect, the first bridge can include a semiconductor material. In another embodiment, the electronic device can further include a conductive member including a gate electrode. The conductive member can overlie and be spaced-apart from the first semiconductor fin and the second semiconductor fin. In yet another embodiment, the conductive member can overlie the first bridge. In still another embodiment, the electronic device can include a third semiconductor fin. The third semiconductor fin can have a third length. The third semiconductor fin can be spaced-apart from each of the first semiconductor fin, the second semiconductor fin, and the first bridge.

In a more particular embodiment of the first aspect, a first insulating layer can lie between the conductive member and the first semiconductor fin and between the conductive member and the second semiconductor fin. In another embodiment, the first semiconductor fin can be electrically coupled to a first source/drain region and a second source/drain region spaced-apart from the first source/drain region. The second semiconductor fin can be electrically coupled to a third source/drain region and a fourth source/drain region spaced-apart from the third source/drain region. The first source/drain region can be electrically coupled to the third source/drain region, and the second source/drain region can be electrically coupled to the fourth source/drain region.

In a particular embodiment of the first aspect, the first bridge can contact the first semiconductor fin between the first source/drain region and the second source/drain region. The first bridge can contact the second semiconductor fin between the third source/drain region and the fourth source/drain region. In a more particular embodiment, the first bridge contacts the first semiconductor fin a first distance from the first source/drain region. The first bridge contacts the second semiconductor fin a second distance from the third source/drain region, and the first distance is shorter than the second distance.

In another more particular embodiment of the first aspect, the electronic device can include a transistor structure. The transistor structure can include the first semiconductor fin, the second semiconductor fin, and the first bridge. The transistor structure can also include the first source/drain region, the second source/drain region, the third source/drain region, and the fourth source/drain region. The transistor structure can further include a gate electrode that lies adjacent to opposing sides of the first semiconductor fin and opposing sides of the second semiconductor fin. The transistor structure can still further include a first channel region lying within the first semiconductor fin and between the first source/drain region and the second source/drain region. The transistor structure can also include a second channel region lying with the second semiconductor fin and between the third source/drain region and the fourth source/drain region. The first channel region and the second channel region can be configured, such that when the transistor would be on, charge carriers would flow through the first channel region, the second channel region, or any combination thereof in a direction substantially parallel to a primary surface of a base layer.

In another embodiment of the first aspect, the first semiconductor fin has a first thickness, and the second semiconductor fin has a second thickness substantially a same as the first thickness. The first bridge can have a third thickness less than the first thickness. In still another embodiment, the electronic device can further include a base layer and a second insulating layer. The second insulating layer can lie between the base layer and the first semiconductor fin. The second insulating layer can also lie between the base layer and the second semiconductor fin. The first length of the first semiconductor fin can be substantially a same as the second length of the second semiconductor fin. In yet another embodiment, the electronic device can further include a second bridge lying between the first semiconductor fin and the second semiconductor fin. The second bridge can be spaced-apart from the first bridge. In another embodiment, the electronic device can further include a second bridge lying between the first semiconductor fin and the second semiconductor fin. The first bridge can have a third length, and the second bridge can have a fourth length. The first bridge can contact the second bridge along only a portion of the fourth length, and the second bridge can contact the first bridge along only a portion of the third length.

In a second aspect, an electronic device can include a transistor structure. The transistor structure can include a first semiconductor fin including a first channel region, and a second semiconductor fin spaced-apart from the first semiconductor fin and including a second channel region. The electronic device can also include a bridge lying between the first semiconductor fin and the second semiconductor fin and contacting the first semiconductor fin and the second semiconductor fin. The electronic device can further include a conductive member, overlying the first semiconductor fin, the second semiconductor fin, and the bridge. A portion of the conductive member can lie adjacent to both sides of the first semiconductor fin and can lie adjacent to both sides of the second semiconductor fin. The first channel region of the first semiconductor fin and the second channel region of the second semiconductor fin can each be configured such that when the transistor would be on, charge carriers would flow through first channel region, the second channel region, or any combination thereof in a direction substantially parallel to a primary surface of the electronic device.

In a third aspect, a process of forming an electronic device can include providing a substrate including a base layer, an insulating layer, and a semiconductor layer. The insulating layer can lie between the base layer and the semiconductor layer. The process can also include forming a first semiconductor fin from the semiconductor layer. The process can still further include forming a second semiconductor fin from the semiconductor layer, wherein the second semiconductor fin is spaced-apart from the first semiconductor fin. The process can yet further include forming a bridge over the insulating layer, wherein the bridge contacts the first semiconductor fin and the second semiconductor fin. The process can also include forming a conductive member, including a gate electrode, over the first semiconductor fin, the second semiconductor fin, and the bridge, wherein the conductive member lies between the first semiconductor fin and the second semiconductor fin.

In one embodiment of the third aspect, the process can include forming a first source/drain region and a second source/drain region spaced-apart from the first source/drain region. The first semiconductor fin can lie between and be electrically connected to the first source/drain region and the second source/drain region. The second semiconductor fin can lie between and be electrically connected to the first source/drain region and the second source/drain region. In another embodiment, forming the first semiconductor fin and forming the second semiconductor fin occur simultaneously at a substantially same point in time. In a more particular embodiment, forming the bridge and forming the first semiconductor layer occur simultaneously at a substantially same point in time. In still another embodiment, the process can further include removing a portion of the insulating layer adjacent to the first semiconductor fin.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires. For example, a bulk semiconductor substrate can be used in place of the combination of the base layer 12, the insulating layer 14, and the semiconductor layer 16. The first semiconductor fin and the second semiconductor fin can be formed from a top portion of the bulk semiconductor substrate and the insulating layer 14 would not be present in the substantially complete electronic device. In another example, after formation of the first semiconductor fin and the second semiconductor fin, the remaining portion of the protective layer 18 can be removed from the workpiece 10 such that a portion of the protective layer 18 may or may not be present in the substantially complete electronic device.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    providing a base layer including a semiconductor material, an insulating layer overlying the base layer, and a semiconductor layer overlying the insulating layer;
    forming a first semiconductor fin from the semiconductor layer, wherein forming the first semiconductor fin comprises forming the first semiconductor fin spaced apart from the base layer and having a first length;
    forming a second semiconductor fin from the semiconductor layer and spaced-apart from the first semiconductor fin, wherein forming the second semiconductor fin comprises forming the second semiconductor fin spaced apart from the base layer and having a second length;
    forming a first bridge lying between the first semiconductor fin and the second semiconductor fin, wherein forming the first bridge comprises forming the first bridge such that the first bridge contacts the first semiconductor fin along only a portion of the first length, and the second semiconductor fin along only a portion of the second length;
    forming a first source/drain region within the first semiconductor fin and a second source/drain region within the second semiconductor fin, wherein the first and second source/drain regions are spaced-apart from and electrically coupled to each other; and forming a third source/drain region within the first semiconductor fin and a fourth source/drain region within the second semiconductor fin, wherein the third and fourth source/drain regions are spaced-apart from and electrically coupled to each other.

2. The process of claim 1, further comprising forming a conductive member overlying the first bridge and including a gate electrode, wherein the conductive member overlies and is spaced-apart from the first semiconductor fin and the second semiconductor fin.

3. The process of claim 2, wherein forming a first insulating layer lying between the conductive member and the first semiconductor fin and between the conductive member and the second semiconductor fin.

4. The process of claim 1, wherein forming the first semiconductor fin and forming the second semiconductor fin are performed such that lengths of the first and second semiconductor fins are substantially perpendicular to a length of the conductive member, and the first and second semiconductor fins are substantially parallel and lie along different lines as compared to each other.

5. The process of claim 4, further comprising forming a third semiconductor fin, wherein forming the third semiconductor fin comprises forming the third semiconductor fin having a third length and spaced-apart from each of the first semiconductor fin, the second semiconductor fin, and the first bridge.

6. The process of claim 1, wherein:
forming the first bridge is performed such that the first bridge contacts the first semiconductor fin between the first source/drain region and the second source/drain region; and
forming the first bridge is performed such that the first bridge contacts the second semiconductor fin between the third source/drain region and the fourth source/drain region.

7. The process of claim 6, wherein:
forming the first bridge is performed such that the first bridge contacts the first semiconductor fin a first distance from the first source/drain region;
forming the first bridge is performed such that the first bridge contacts the second semiconductor fin a second distance from the third source/drain region; and
the first distance is shorter than the second distance.

8. The process of claim 1, wherein the electronic device comprises a transistor structure, wherein the process comprises:
patterning the semiconductor layer to form the first semiconductor fin, the second semiconductor fin, and the first bridge;
forming a gate electrode adjacent to opposing sides of the first semiconductor fin and opposing sides of the second semiconductor fin;
forming the first source/drain region and forming a second source/drain region from portions of the first semiconductor fin that are not covered by the gate electrode to define a first channel region lying within the first semiconductor fin, underlying the gate electrode, and between the first source/drain region and the second source/drain region; and
forming the third source/drain region and the fourth source/drain region from portions of the second semiconductor fin that are not covered by the gate electrode to define a second channel region lying with the second semiconductor fin, underlying the gate electrode, and between the third source/drain region and the fourth source/drain region,
wherein the first channel region and the second channel region are configured, such that when the transistor would be on, charge carriers would flow through the first channel region, the second channel region, or any combination thereof in a direction substantially parallel to a primary surface of a base layer.

9. The process of claim 1, wherein:
forming the first semiconductor fin comprises forming the first semiconductor fin having a first thickness;
forming the second semiconductor comprises forming the second semiconductor fin having a second thickness substantially a same as the first thickness; and
forming the first bridge comprises forming the first bridge having a third thickness less than the first thickness.

10. The process of claim 1, further including:
providing a substrate including a base layer, a second insulating layer, and the semiconductor layer, wherein the insulating layer lies between the base layer and the semiconductor layer,
wherein the first length of the first semiconductor fin is substantially a same as the second length of the second semiconductor fin.

11. The process of claim 1, further comprising forming a second bridge lying between the first semiconductor fin and the second semiconductor fin, wherein the second bridge is spaced-apart from the first bridge.

12. The process of claim 1, further comprising forming a second bridge lying between the first semiconductor fin and the second semiconductor fin wherein:
the first bridge has a third length;
the second bridge has a fourth length;
the first bridge contacts the second bridge along only a portion of the fourth length; and
the second bridge contacts the first bridge along only a portion of the third length.

13. The process of claim 1, wherein forming the first bridge comprises forming the first bridge from the semiconductor layer.

14. A process of forming an electronic device comprising a transistor, wherein the process includes:
forming a first semiconductor fin;
forming a second semiconductor fin spaced-apart from the first semiconductor fin;
forming a first portion of a semiconductor layer between the first semiconductor fin and the second semiconductor fin and contacting the first semiconductor fin and the second semiconductor fin at locations adjacent to ends of the first and second semiconductor fins;
forming a second portion of the semiconductor layer between the first semiconductor fin and the second semiconductor fin and contacting the first semiconductor fin and the second semiconductor fin at locations adjacent to opposite ends of the first and second semiconductor fins;
forming a conductive member overlying the first semiconductor fin and the second semiconductor fin, wherein forming the conductive member is performed such that a portion of the conductive member lies adjacent to both sides of the first semiconductor fin and lies adjacent to opposite sides of the second semiconductor fin;
forming first source/drain regions that include portions of the first semiconductor fin and the second semiconductor fin and are electrically connected to each other by the first portion of the semiconductor layer; and forming second source/drain regions that include other portions of the first semiconductor fin and the second semiconductor fin and are electrically connected to each other by the second portion of the semiconductor layer, wherein the second source/drain regions are spaced apart from the first source drain regions, wherein:

a first channel region of the transistor lies within the first semiconductor fin at a location between the first and second source/drain regions;

a second channel region of the transistor lies within the second semiconductor fin at another location between the first and second source/drain regions; and when the transistor would be on, charge carriers would flow through first channel region, the second channel region, or any combination thereof in a direction substantially parallel to a primary surface of the electronic device.

* * * * *